United States Patent
Kil et al.

(10) Patent No.: US 8,288,274 B2
(45) Date of Patent: Oct. 16, 2012

(54) METHOD OF FORMING NOBLE METAL LAYER USING OZONE REACTION GAS

(75) Inventors: Deok-Sin Kil, Icheon-si (KR);
Kee-Jeung Lee, Icheon-si (KR);
Young-Dae Kim, Icheon-si (KR);
Jin-Hyock Kim, Icheon-si (KR);
Kwan-Woo Do, Icheon-si (KR);
Kyung-Woong Park, Icheon-si (KR);
Jeong-Yeop Lee, Icheon-si (KR);
Ja-Yong Kim, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 240 days.

(21) Appl. No.: 12/318,468

(22) Filed: Dec. 30, 2008

(65) Prior Publication Data

US 2009/0263967 A1  Oct. 22, 2009

(30) Foreign Application Priority Data

Apr. 21, 2008 (KR) .................. 10-2008-0036612
Oct. 2, 2008 (KR) .................. 10-2008-0097350

(51) Int. Cl.
*H01L 21/4763* (2006.01)

(52) U.S. Cl. .. 438/650; 438/686; 438/706; 257/E21.161

(58) Field of Classification Search .................. 438/650, 438/686, 694, 706; 427/125, 255.28; 257/E21.161, 257/E21.17

See application file for complete search history.

(56) References Cited

U.S. PATENT DOCUMENTS

| 6,607,988 B2 * | 8/2003 | Yunogami et al. | 438/720 |
|---|---|---|---|
| 6,699,768 B2 * | 3/2004 | Kim | 438/396 |
| 6,713,373 B1 * | 3/2004 | Omstead | 438/608 |
| 7,476,618 B2 * | 1/2009 | Kilpela et al. | 438/686 |
| 7,666,773 B2 * | 2/2010 | Huotari et al. | 438/584 |
| 2003/0233976 A1 | 12/2003 | Marsh et al. | |
| 2005/0017625 A1 | 1/2005 | Miyaji et al. | |

FOREIGN PATENT DOCUMENTS

| KR | 1020010031981 | 4/2001 |
|---|---|---|
| KR | 2003-0047375 | 6/2003 |
| KR | 2003-0056789 | 7/2003 |
| KR | 1020080029606 | 4/2008 |

OTHER PUBLICATIONS

Nakahara, M., et al., "Etching technique for ruthenium with a high etch rate and high selectivity using ozone gas", J. Vac. Sci. Technol. B 19(6), Nov./Dec. 2001, pp. 2133-2136.*
Chinese Office Action for Chinese application No. 200910001299.1, citing the attached reference(s), Apr. 22, 2010.

\* cited by examiner

*Primary Examiner* — Tuan N. Quach
(74) *Attorney, Agent, or Firm* — Lowe Hauptman Ham & Berner, LLP

(57) ABSTRACT

A noble metal layer is formed using ozone ($O_3$) as a reaction gas.

7 Claims, 11 Drawing Sheets

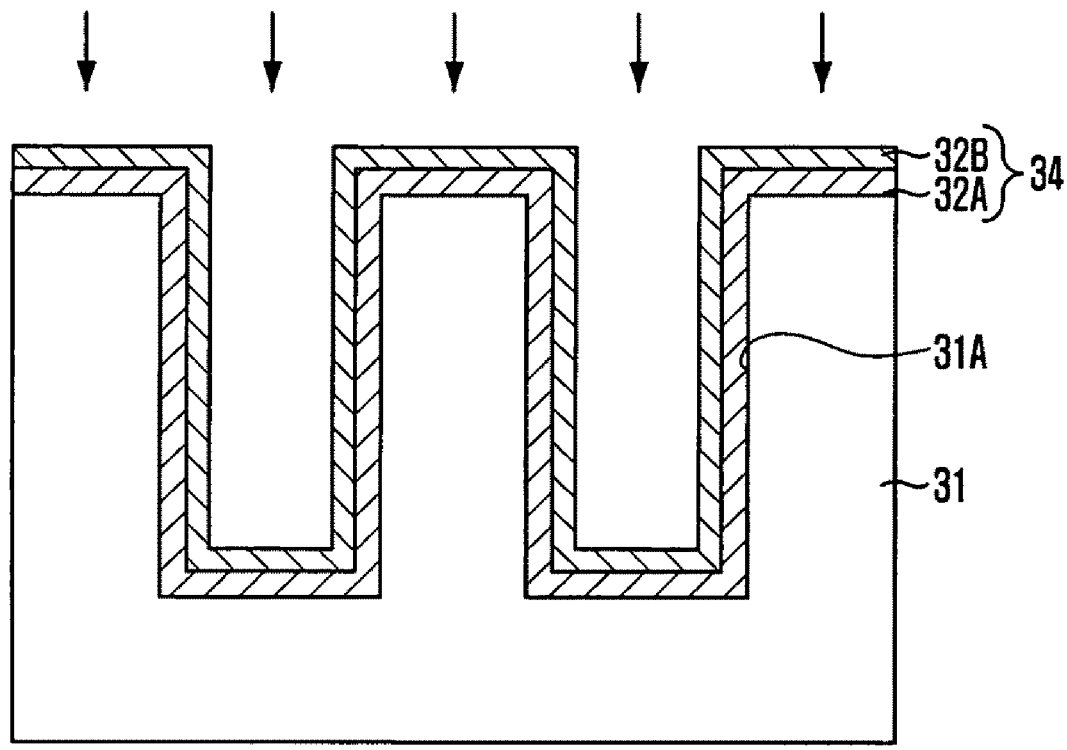

METHOD OF FORMING NOBLE METAL LAYER USING OZONE REACTION GAS

CROSS-REFERENCES TO RELATED APPLICATIONS

The present application claims priority of Korean patent applications numbers 10-2008-0036612 and 10-2008-0097350, filed on Apr. 21, 2008, and Oct. 2, 2008, respectively, which are incorporated by reference herein in their entirety.

BACKGROUND

The disclosure relates to a method of fabricating a semiconductor device, and more particularly, to a method of forming a noble metal layer.

Recently, the technology of using noble metal layers including ruthenium (Ru) or Iridium (Ir) layers as the electrode material in a dynamic random access memory (DRAM) or ferroelectric random access memory (FeRAM) has been introduced.

Noble metal layers including ruthenium and iridium layers are formed using a chemical vapor deposition (CVD) method or an atomic layer deposition (ALD) method. Also, a deposition source that includes an organic metal compound is required. The organic metal compound is often referred to as a precursor.

When using a CVD method or an ALD method to form a noble metal layer, a reaction gas is used to decompose the organic metal compound. The reaction gas often includes oxygen ($O_2$), hydrogen ($H_2$), and ammonia ($NH_3$).

When using ammonia or hydrogen as a reaction gas, reactivity is quite low and thus, to obtain proper deposition results, the deposition temperature is often raised to approximately 500° C. or higher. Even if a plasma is used, the deposition rate is still quite low. In particular, when forming a noble metal layer over a dielectric layer including a zirconium dioxide ($ZrO_2$) layer, characteristics of the dielectric layer formed below the noble metal layer deteriorate due to the high deposition temperature.

In order to improve this limitation, oxygen may be used as a reaction gas because using oxygen allows the deposition process to be performed as a low temperature process.

However, using oxygen as a reaction gas may require a very long incubation time because the substrate dependency is high. When the incubation time is long, the surface of the noble metal layer being formed often becomes very rough and the growth rate is quite slow.

Furthermore, using oxygen as a reaction gas when performing the deposition process at a low temperature may result in a rapidly decreasing deposition rate which, in turn, would deteriorate mass productivity.

Thus, using oxygen, hydrogen, or ammonia for forming a noble metal layer may make it difficult to obtain sufficient adhesive property and mass productivity of the noble metal layer.

SUMMARY

In accordance with an embodiment, a method of forming a noble metal layer includes: using ozone ($O_3$) having a concentration level of approximately 100 g/m$^3$ or less as a reaction gas.

In accordance with another embodiment, a method of forming a noble metal layer includes: using ozone ($O_3$) as a reaction gas at a concentration level ranging from approximately 50 g/m$^3$ to approximately 300 g/m$^3$ and at a substrate temperature ranging from approximately 150° C. to approximately 275° C.

In accordance with a further embodiment, a method of forming a noble metal layer includes: performing a deposition process using ozone ($O_3$) having a first concentration level as a reaction gas; and performing an etch process using ozone having a second concentration level, wherein the first concentration level of the ozone is lower than the second concentration level of the ozone.

BRIEF DESCRIPTION OF THE DRAWINGS

FIGS. 8A to 8C are cross-sectional views showing a method of forming a ruthenium layer in accordance with a fourth embodiment.

DESCRIPTION OF EMBODIMENTS

Figure 1:
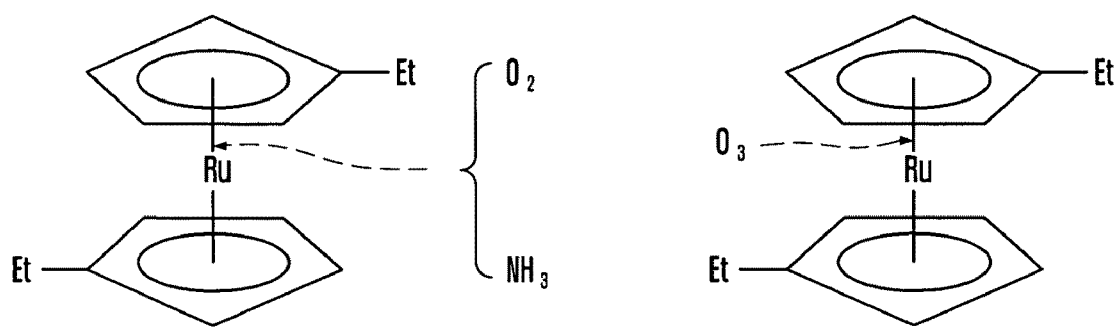
FIG. 1 includes diagrams showing decomposition of a ruthenium source using different reaction gases.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout the drawings.

In accordance with various embodiments, a noble metal layer having a large deposition rate during a low temperature process and conformal characteristics are obtained using ozone with high reactivity as the reaction gas.

Furthermore, if a conformal noble metal layer formed at a low temperature and having a large deposition rate is used as an electrode in a capacitor, it is possible in some embodiments to form a capacitor having a sufficient level of mass productivity and good characteristics due to the high work function of the noble metal layer. Thus, in some embodiments, a dynamic random access memory (DRAM) and a ferroelectric random access memory (FeRAM) smaller than approximately 40 nm are obtained.

In accordance with various embodiments, ozone ($O_3$), which can control reactivity, is used as a reaction gas for forming a noble metal layer instead of typical oxygen ($O_2$), hydrogen ($H_2$) or ammonia ($NH_3$).

Although ozone has higher reactivity than oxygen, ozone concentration in the chamber is controllable. Thus, when forming a noble metal layer using ozone as a reaction gas, deposition characteristics and properties of the noble metal layer are easily controllable through controlling the ozone concentration level in the chamber.

Forming a noble metal layer by adequately controlling the concentration of ozone increases the deposition rate compared to typically used oxygen. Also, reactivity at the surface of a substrate underlying the noble metal layer is improved to reduce the incubation time. Thus, in some embodiments, a thin layer is consistently obtained despite its very small thickness.

Furthermore, a high concentration level of ozone may cause the noble metal layer being formed to be etched. Using this property, a conformal thin layer in some embodiments is formed to have a uniform thickness even in a very narrow trench. In other words, by repeating a process of forming a noble metal layer using low concentration ozone and then etching the noble metal layer using high concentration ozone, a noble metal layer having a uniform thickness and a deep pattern with a very high aspect ratio in some embodiments is obtained.

Methods of forming a noble metal layer using ozone as a reaction gas are applicable to at least a chemical vapor deposition (CVD) method or an atomic layer deposition (ALD) method.

FIG. 1 includes diagrams showing decomposition of a ruthenium source using different reaction gases.

In FIG. 1, oxygen ($O_2$), ammonia ($NH_3$), and ozone ($O_3$) used as a reaction gas help forming a pure ruthenium layer by decomposing ligand (EtCp) from a ruthenium source Ru(EtCp)$_2$. The ruthenium source Ru(EtCp)$_2$ includes ruthenium and ligand.

Comparing reactivity of each reaction gas, ozone has higher reactivity than oxygen and ammonia, and oxygen has higher reactivity than ammonia. Higher reactivity means that it is easier to decompose ligand. Reference denotation "<<" represents the level of reactivity.

An ALD method includes supplying reaction sources in order into a chamber and then purging to form a plurality of atomic layers in order over a substrate.

The ALD method is a deposition method which uses chemical reaction like the CVD method. But the ALD method is different from the CVD method because for the ALD method, the reaction sources are not mixed in the chamber. For example, when using A gas and B gas in the ALD method, a process order of supplying A gas, purging, supplying B gas, and purging is used. The process is described in detail in the following section.

A gas is supplied into a chamber. At this time, molecules of A gas are chemically adsorbed. Then remaining A gas in the chamber is purged with an inert gas. B gas is then supplied into the chamber. Reaction between A gas and B gas only occurs on surfaces where the chemically adsorbed A gas remains, forming a thin atomic layer. Thus, step coverage is approximately 100% secured for a surface with any sort of morphology. After A gas and B gas have reacted with each other, remaining B gas and reaction by-products in the chamber are purged.

The thickness of a thin layer is controlled by repeatedly performing the process described above until a desired thickness is obtained. In other words, the thickness of a thin layer formed by an ALD method is closely linked with the number of repetition of the formation process.

Figure 2:
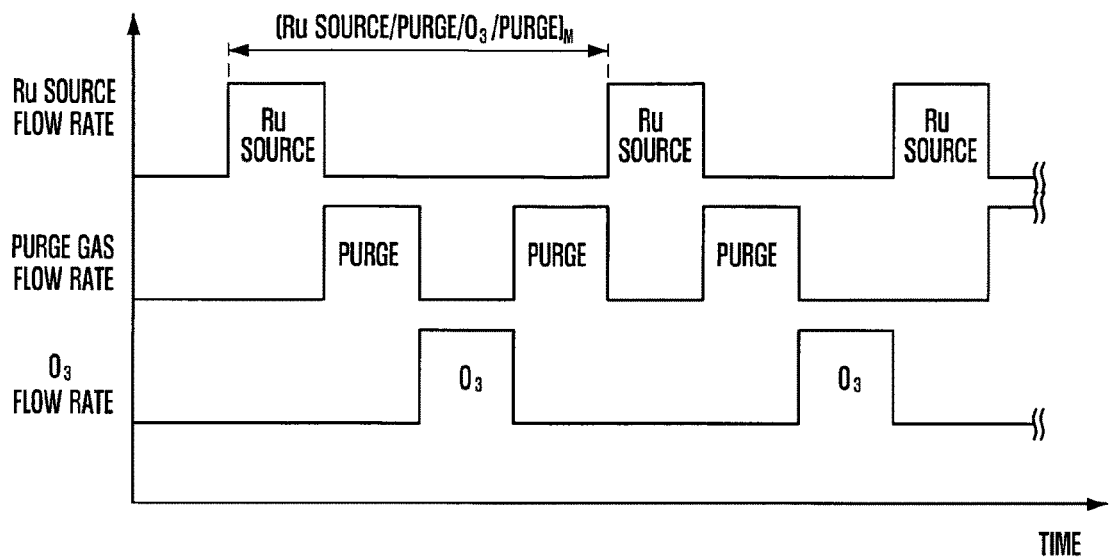
FIG. 2 is a timing diagram showing an atomic layer deposition (ALD) method of forming a ruthenium layer in accordance with a first embodiment.

FIG. 2 is a timing diagram showing an atomic layer deposition (ALD) method of forming a ruthenium (Ru) layer in accordance with a first embodiment.

In FIG. 2, atomic layer deposition of a ruthenium layer includes repeatedly performing a process of Ru source/purge/reaction gas/purge for M times. The process of Ru source/purge/reaction gas/purge refers to a process that includes supplying a ruthenium source, purging, supplying a reaction gas, and another purging. The process of Ru source/purge/reaction gas/purge is a unit cycle for atomic layer deposition of the ruthenium layer. According to the first embodiment, the reaction gas includes ozone ($O_3$). Thus, the unit cycle for atomic layer deposition of the ruthenium layer is Ru source/purge/$O_3$/purge.

Supplying the ruthenium source includes supplying the ruthenium source into a chamber including a substrate whereon a ruthenium layer is to be formed. The ruthenium source is then adsorbed on the surface of the substrate. The ruthenium source includes at least one selected from the group consisting of Ru(Cp)$_2$, Ru(MeCp)$_2$, Ru(EtCp)$_2$, Ru(tmhd)$_3$, Ru(mhd)$_3$, and Ru(od)$_3$. Ru(Cp)$_2$, Ru(MeCp)$_2$, and Ru(EtCp)$_2$ have a structure where cyclopenta (C$_5$H$_5$) coupling ligand is combined with ruthenium metal atoms at the center, whereas Ru(tmhd)$_3$, Ru(mhd)$_3$, and Ru(od)$_3$ are sources that have β-diketon-based ligand. Meanwhile, ligand refers to atoms, molecules, and ions including ammonia (NH$_3$), water (H$_2$O), chlorine anion (Cl—), and cyanide anion (CN—) that have unshared electron pairs. The ruthenium sources include solid or liquid organic metal compounds and in some embodiments is supplied into the chamber in a gaseous state after being vaporized through a separate vaporizer. Also, the above described ruthenium sources are referred to as ruthenium precursors comprising ruthenium.

Ligand adhering to ruthenium metal atoms in the above described ruthenium sources reacts with the reaction gas to form a ruthenium layer. The substrate on which the ruthenium layer is to be formed in some embodiments includes a silicon (Si) layer, a silicon oxide (SiO$_2$) layer, a metal layer including a titanium (Ti) layer, a metal nitride layer including a titanium nitride (TiN) layer, and a dielectric layer including a zirconium dioxide (ZrO$_2$) layer. When performing an atomic layer deposition process, a deposition temperature ranging from approximately 150° C. to approximately 400° C. is maintained. If the deposition temperature is lower than approximately 150° C., the ruthenium source may not be adsorbed on the surface of the substrate. If the deposition temperature is higher than approximately 400° C., the substrate may be damaged by the high temperature. For instance, the deposition temperature in some embodiments ranges from approximately 150° C. to approximately 275° C. As will be described later on, the deposition temperature is variable depending on the concentration level of ozone. The deposition temperature is often referred to as a substrate temperature.

Purging includes removing the residual ruthenium source after the adsorption reaction. A purge gas in some embodiments includes an inert gas which does not react with the ruthenium source such as argon (Ar) and/or nitrogen ($N_2$). Also, the residual ruthenium source in some embodiments is removed by pumping.

Supplying a reaction gas includes supplying a reaction gas into the chamber to remove ligand from the adsorbed ruthenium source. The reaction gas includes ozone. Ozone in some embodiments includes ozone generated by an ozonizer. Ozone is supplied for a time period of approximately 5 seconds or less, flowing at approximately 100 sccm to approximately 2,000 sccm.

The other purging includes purging reaction by-products generated by the ozone-ligand reaction as well as residual ozone from the chamber. An inert gas, including argon and/or nitrogen, is used during the other purging. Also, the other purging in some embodiments includes removing the residual ruthenium source by pumping.

A ruthenium layer in atomic layer unit having a sufficient level of step coverage is formed in some embodiments by repeating the unit cycle of Ru source/purge/$O_3$/purge M times.

According to the first embodiment, the reaction gas for decomposing the ruthenium source includes ozone. Ozone allows forming a pure ruthenium layer which does not contain oxygen by removing ligand including carbon (C), hydrogen (H), and oxygen (O) adhering to the ruthenium source.

The concentration level of ozone should be controlled because if the ozone concentration or flow is excessive, the adsorbed ruthenium source may be separated or etched, for instance, when the concentration level of ozone ranges from approximately 20 $g/m^3$ to approximately 350 $g/m^3$. The concentration level of ozone in some embodiments is controlled to range from approximately 20 $g/m^3$ to approximately 100 $g/m^3$. Controlling the concentration level of ozone further accelerates the reaction with the ruthenium source at the surface of the substrate. Consequently, a uniform and continuous ruthenium layer is formed to a small thickness while minimizing the incubation time.

If the concentration level of ozone is less than approximately 20 $g/m^3$, the reaction with the ruthenium source may not be sufficient and thus may cause a large amount of impurities to form within the ruthenium layer. If the concentration level of ozone is higher than approximately 100 $g/m^3$, the adsorbed ruthenium source may be separated or etched, causing damage to the resulting ruthenium layer. Therefore, the concentration level of ozone in some embodiments ranges from approximately 20 $g/m^3$ to approximately 100 $g/m^3$.

Furthermore, ozone generally has higher reactivity than oxygen. Thus, the impurity concentration within the ruthenium layer is minimizable, and the ruthenium layer is formable at a low temperature. The high reactivity allows lowering of a deposition temperature during the formation of the ruthenium layer, and thus the ruthenium layer in some embodiments is formable at a low temperature.

Figure 3:
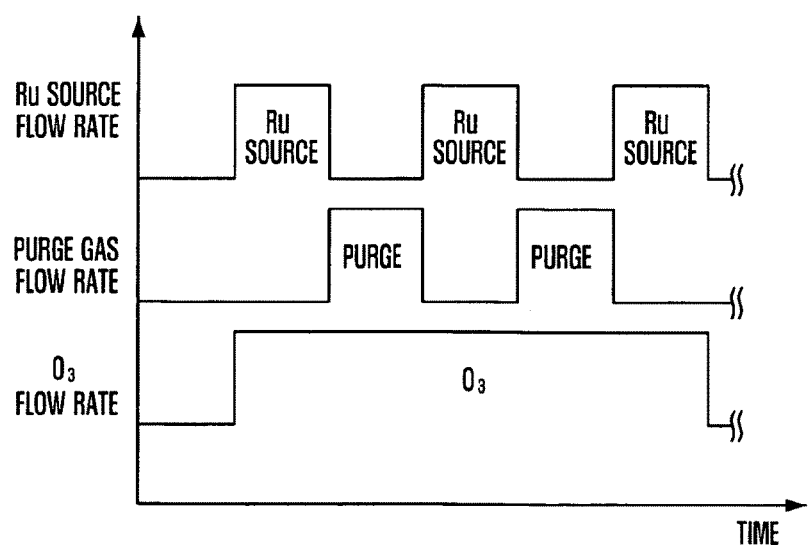
FIG. 3 is a timing diagram showing an ALD method of forming a ruthenium layer in accordance with a second embodiment.

FIG. 3 is a timing diagram showing an atomic layer deposition (ALD) method of forming a ruthenium (Ru) layer in accordance with a second embodiment.

In FIG. 3, atomic layer deposition of a ruthenium layer according to the second embodiment includes repeatedly performing a process of supplying a ruthenium source and purging while continuously supplying ozone ($O_3$).

Supplying the ruthenium source includes supplying the ruthenium source into a chamber including a substrate whereon a ruthenium layer is to be formed. The ruthenium source is then adsorbed on the surface of the substrate by supplying the ruthenium source. The ruthenium source in some embodiments includes at least one selected from the group consisting of $Ru(Cp)_2$, $Ru(MeCp)_2$, $Ru(EtCp)_2$, $Ru(tmhd)_3$, $Ru(mhd)_3$, and $Ru(od)_3$. $Ru(Cp)_2$, $Ru(MeCp)_2$, and $Ru(EtCp)_2$ have a structure where cyclopenta ($C_5H_5$) coupling ligand is combined with ruthenium metal atoms at the center, whereas $Ru(tmhd)_3$, $Ru(mhd)_3$, and $Ru(od)_3$ are sources that have β-diketon-based ligand. Meanwhile, ligand refers to atoms, molecules, and ions including ammonia ($NH_3$), water ($H_2O$), chlorine anion (Cl—), and cyanide anion (CN—) that have unshared electron pairs. The ruthenium sources include solid or liquid organic metal compounds and in some embodiments is supplied into the chamber in a gaseous state after being vaporized through a separate vaporizer.

Ligand adhering to ruthenium metal atoms in the above described sources reacts with the reaction gas to form a ruthenium layer. The substrate on which the ruthenium layer is to be formed in some embodiments includes a silicon (Si) layer, a silicon oxide ($SiO_2$) layer, a metal layer including a titanium (Ti) layer, a metal nitride layer including a titanium nitride (TiN) layer, and a dielectric layer including a zirconium dioxide ($ZrO_2$) layer. When performing an atomic layer deposition process, a deposition temperature ranging from approximately 150° C. to approximately 400° C. is maintained. If the deposition temperature is lower than approximately 150° C., the ruthenium source may not be adsorbed on the surface of the substrate. If the deposition temperature is higher than approximately 400° C., the substrate may be damaged by the high temperature. For instance, the deposition temperature in some embodiments ranges from approximately 150° C. to approximately 275° C. As will be described later on, the deposition temperature is variable depending on the concentration level of ozone.

Purging includes removing the residual ruthenium source after the adsorption reaction. A purge gas in some embodiments includes an inert gas which does not react with the ruthenium source such as argon (Ar) and/or nitrogen ($N_2$). Also, the residual ruthenium source in some embodiments is removed by pumping.

Supplying ozone includes supplying ozone to remove ligand from the adsorbed ruthenium source. Ozone in some embodiments includes ozone generated by an ozonizer.

In accordance with the second embodiment, a ruthenium layer is formed by repeatedly performing a process of supplying the ruthenium source and purging while continuously supplying ozone as a reaction gas for decomposing the ruthenium source.

Ozone allows forming a pure ruthenium layer which does not contain oxygen by removing ligand including carbon (C), hydrogen (H), and oxygen (O) adhering to the ruthenium source.

The concentration level of ozone should be controlled because if the ozone concentration or flow is excessive, the adsorbed ruthenium source may be separated or etched. For instance, the concentration level of ozone in some embodiments ranges from approximately 20 $g/m^3$ to approximately 100 $g/m^3$. Controlling the concentration level of ozone further accelerates the reaction with the ruthenium source at the surface of the substrate. Consequently, a uniform and continuous ruthenium layer is formed to a small thickness while minimizing the incubation time.

If the concentration level of ozone is less than approximately 20 $g/m^3$, the reaction with the ruthenium source may not be sufficient and thus may cause a large amount of impurities to form within the ruthenium layer. If the concentration level of ozone is higher than approximately 100 $g/m^3$, the adsorbed ruthenium source may be separated or etched, causing damage to the resulting ruthenium layer. Therefore, the concentration level of ozone in some embodiments ranges from approximately 20 g/m$^3$ to approximately 100 g/m$^3$.

Furthermore, ozone generally has higher reactivity than oxygen. Thus, the impurity concentration within the ruthenium layer is minimizable, and the ruthenium layer is formable at a low temperature. The high reactivity allows lowering of a deposition temperature during the formation of the ruthenium layer, and thus the ruthenium layer is formable at a low temperature.

Unlike the ALD method, a chemical vapor deposition (CVD) method includes supplying reaction sources at substantially the same time to form a thin layer. For instance, when A gas and B gas are used, A gas and B gas are supplied at substantially the same time to form a thin layer on a substrate.

In the following section, a CVD method of forming a ruthenium layer in accordance with a third embodiment is described. Thus, A gas represents a ruthenium source and B gas represents a reaction gas for decomposing the ruthenium source. When a CVD method uses a ruthenium source including an organic metal compound, the CVD method is referred to as a metal organic chemical vapor deposition method.

Figure 4:
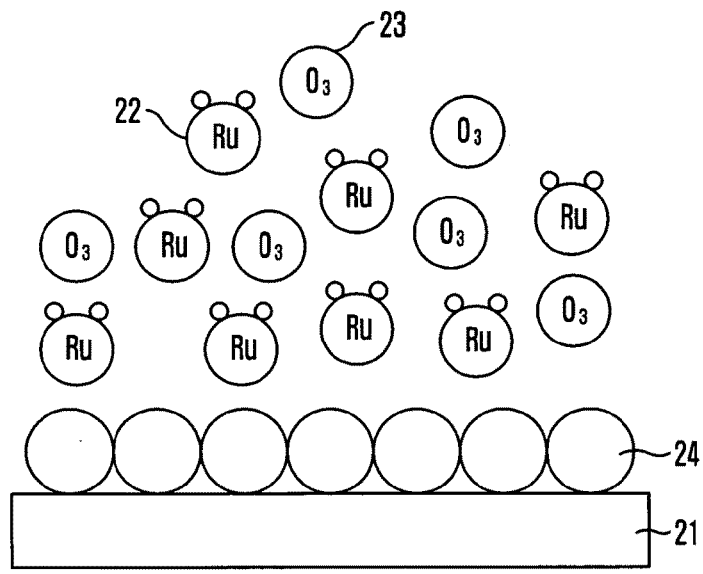
FIG. 4 is a diagram showing a chemical vapor deposition (CVD) method of forming a ruthenium layer in accordance with a third embodiment.

FIG. 4 is a diagram showing a chemical vapor deposition (CVD) method of forming a ruthenium (Ru) layer in accordance with the third embodiment.

In FIG. 4, chemical vapor deposition of a ruthenium layer includes supplying a ruthenium source 22 and a reaction gas 23 at substantially the same time to form a ruthenium layer 24 over a substrate 21. Reaction by-products are removed by purging. Purging in some embodiments includes blowing inert gas such as argon (Ar) and/or nitrogen (N$_2$) or pumping.

The reaction gas 23 includes ozone (O$_3$). Ozone in some embodiments includes ozone generated by an ozonizer or other methods. The other methods include a method of generating ozone by reacting oxygen gas and nitrogen gas. There are many other methods to generate ozone.

The ruthenium source 22 in some embodiments includes at least one selected from the group consisting of Ru(Cp)$_2$, Ru(MeCp)$_2$, Ru(EtCp)$_2$, Ru(tmhd)$_3$, Ru(mhd)$_3$, and Ru(od)$_3$. Ru(Cp)$_2$, Ru(MeCp)$_2$, and Ru(EtCp)$_2$ have a structure where cyclopenta (C$_5$H$_5$) coupling ligand is combined with ruthenium metal atoms at the center, whereas Ru(tmhd)$_3$, Ru(mhd)$_3$, and Ru(od)$_3$ are sources that have β-diketon-based ligand. Meanwhile, ligand refers to atoms, molecules, and ions including ammonia (NH$_3$), water (H$_2$O), chlorine anion (Cl—), and cyanide anion (CN—) that have unshared electron pairs. The ruthenium source 22 includes a solid or liquid organic metal compound and in some embodiments is supplied into the chamber in a gaseous state after being vaporized through a separate vaporizer.

Ligand adhering to ruthenium metal atoms in the ruthenium source 22 reacts with the reaction gas 23 to form the ruthenium layer 24. The substrate 21 on which the ruthenium layer 24 is to be formed in some embodiments includes a silicon (Si) layer, a silicon oxide (SiO$_2$) layer, a metal layer including a titanium (Ti) layer, a metal nitride layer including a titanium nitride (TiN) layer, and a dielectric layer including a zirconium dioxide (ZrO$_2$) layer. When performing a chemical vapor deposition process, a temperature ranging from approximately 150° C. to approximately 400° C. is maintained. If the deposition temperature is lower than approximately 150° C., the ruthenium source 22 may not be adsorbed on the surface of the substrate 21. If the deposition temperature is higher than approximately 400° C., the substrate 21 may be damaged by the high temperature. For instance, the deposition temperature in some embodiments ranges from approximately 150° C. to approximately 275° C. As will be described later on, the deposition temperature is variable depending on the concentration level of ozone.

According to the third embodiment, the reaction gas 23 includes ozone for decomposing the ruthenium source 22. The concentration level of ozone should be controlled because if the ozone concentration or flow is excessive, the adsorbed ruthenium source 22 may be separated or etched. For instance, the concentration level of ozone ranges from approximately 20 g/m$^3$ to approximately 100 g/m$^3$. Controlling the concentration level of ozone further accelerates the reaction with the ruthenium source 22 at the surface of the substrate 21. Consequently, the ruthenium layer 24 that is uniform and continuous is formed to a small thickness while minimizing the incubation time. Furthermore, ozone generally has higher reactivity than oxygen. Thus, the impurity concentration within the ruthenium layer 24 is minimizable, and the ruthenium layer 24 is formable at a low temperature.

If the concentration level of ozone is less than approximately 20 g/m$^3$, the reaction with the ruthenium source 22 may not be sufficient and thus may cause a large amount of impurities to form within the ruthenium layer 24. If the concentration level of ozone is higher than approximately 100 g/m$^3$, the adsorbed ruthenium source 22 may be separated or etched, causing damage to the resulting ruthenium layer 24. Therefore, the concentration level of ozone in some embodiments ranges from approximately 20 g/m$^3$ to approximately 100 g/m$^3$.

Figure 5:
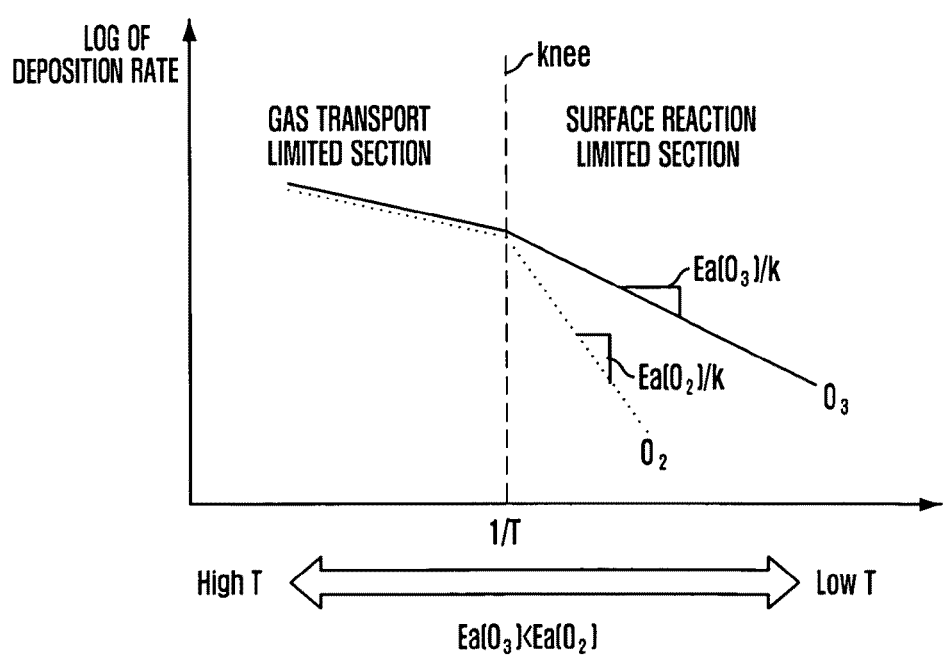
FIG. 5 is a diagram showing Arrhenius plots displaying the effect of the deposition temperature on the deposition rate during the formation of a ruthenium layer over a substrate.

FIG. 5 is a diagram showing Arrhenius plots displaying the effect of the deposition temperature on the deposition rate during the formation of a ruthenium layer over a substrate. The Arrhenius plots display the logarithm of the deposition rate plotted against the inverse temperature (1/T). The Arrhenius plots are presented for the understanding of kinetic reactions and also for the determination of the temperature sensitivity of a deposition process. The deposition process may need to be performed at a temperature below a "knee" temperature within a kinetically limited range. The "knee" temperature is defined as the transition temperature between a gas transport limited section and a surface reaction limited section.

In FIG. 5, both ozone and oxygen have substantially the same "knee" temperature which marks a changing point from a temperature-dependent deposition rate to a temperature-independent deposition rate.

In the Arrhenius plots, a bottom region up to the "knee" temperature shows a clear upward slope. Thus, the deposition temperature plays a great role when performing a deposition process using a reaction gas within the particular temperature range below the "knee" temperature. On the other hand, an upper region above the "knee" temperature shows a substantially gentler slope. Thus, a deposition process within this particular temperature range above the "knee" temperature is independent of the deposition temperature.

The activation energy may be determined from the Arrhenius plots. For instance, the deposition rate R, the temperature T, and the activation energy Ea are related as in the following equation:

$$R = R_o e^{[-Ea/kT]} \qquad \text{[Equation 1]}$$

where R represents a deposition rate, R$_o$ represents a temperature-independent frequency factor, Ea represents activation energy having a unit of eV, and T represents temperature having a unit of k. Thus, the activation energy may be determined by the deposition rate and temperature.

The results shown in the Arrhenius plots in FIG. 5 show that oxygen has larger activation energy (Ea) than ozone. The larger activation energy of oxygen than ozone means that oxygen has lower reactivity than ozone.

When using ozone as a reaction gas, a temperature range of the surface reaction limited section may be decreased to a lower temperature range (Low T) than when oxygen having low reactivity is used. In other words, a ruthenium layer may be formed using ozone at a lower temperature than when using oxygen.

Furthermore, assuming the deposition temperature to be substantially the same, using ozone results in a higher deposition rate than using oxygen. Assuming that the deposition rate is substantially the same, a deposition process may be performed at a lower temperature when using ozone than when using oxygen.

By adequately controlling the concentration level of ozone, substrate-dependency of a ruthenium source is minimizable and the deposition rate is maximizable compared to using oxygen. Also, the high reactivity of ozone allows the deposition temperature to be very low, and so a ruthenium layer is formable at a low temperature. A ruthenium layer in some embodiments is formed using a CVD method at a low temperature in the surface reaction limited section, thus forming a thin layer having a highly sufficient level of step coverage. For instance, the concentration level of ozone is adequately controlled in some embodiments within a range of approximately 20 $g/m^3$ to approximately 100 $g/m^3$ to control reactivity of ozone.

Figure 6:
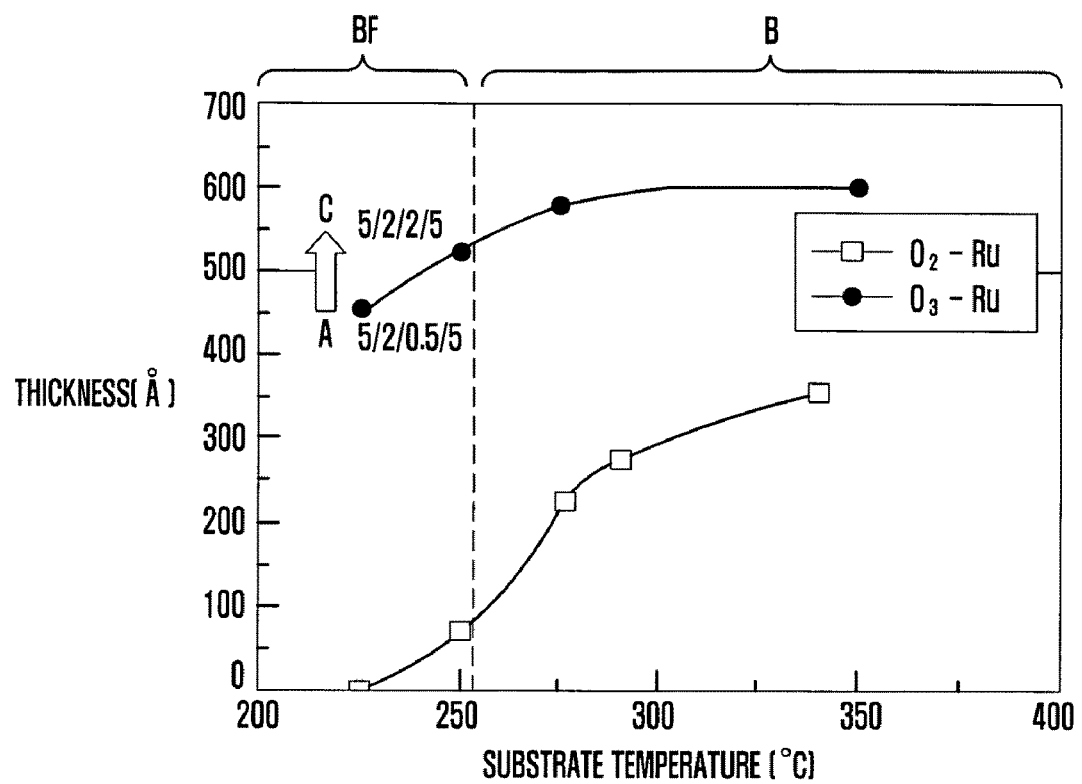
FIG. 6 is a graph comparing the deposition temperatures and the deposition rates during the formation of a ruthenium layer using oxygen and another ruthenium layer formed using ozone, respectively.

FIG. 6 is a graph comparing the deposition temperatures and the deposition rates during the formation of a ruthenium layer formed using oxygen ($O_2$) and another ruthenium layer formed using ozone ($O_3$), respectively.

In FIG. 6, the ruthenium layer formed using ozone, as represented by reference denotation $O_3$—Ru, has a larger deposition thickness than the other ruthenium layer formed using oxygen, as represented by reference denotation $O_2$—Ru, at substantially the same substrate temperature. In other words, when using ozone, a sufficiently large deposition rate may be obtained at a low substrate temperature.

Furthermore, blisters are not generated in both $O_2$—Ru and $O_3$—Ru at a substrate temperature of approximately 250° C. or less. Reference denotation BF refers to blister-free. Meanwhile, although $O_2$—Ru is not making much progress in deposition thickness at the substrate temperature of approximately 250° C. or less, $O_3$—Ru obtained a large deposition thickness of approximately 400 Å at the substrate temperature of approximately 250° C. or less. $O_2$—Ru obtained a very small deposition thickness of approximately 100 Å at the substrate temperature of approximately 250° C. or less.

Meanwhile, different deposition thicknesses are obtainable for $O_3$—Ru, depending on the flow time of ozone. For instance, when $O_3$—Ru uses an atomic layer deposition (ALD) method including Ru source/purge/$O_3$/purge, performing the ALD method for a flow time of 5/2/2/5 seconds, as represented by reference denotation C, results in a larger deposition thickness than performing the ALD method for a flow time of 5/2/0.5/5 seconds, as represented by reference denotation A.

Also, reference denotation B refers to blisters. For $O_3$—Ru, blisters are practically not generated at the substrate temperature of approximately 250° C. or less and yet a very large deposition thickness can be obtained. However, for $O_2$—Ru, while blisters are practically not generated at the substrate temperature of approximately 250° C. or less, deposition is hardly occurring. Thus, forming a ruthenium layer using ozone may result in a very large deposition thickness with very little number of blisters if any.

Figure 7A:
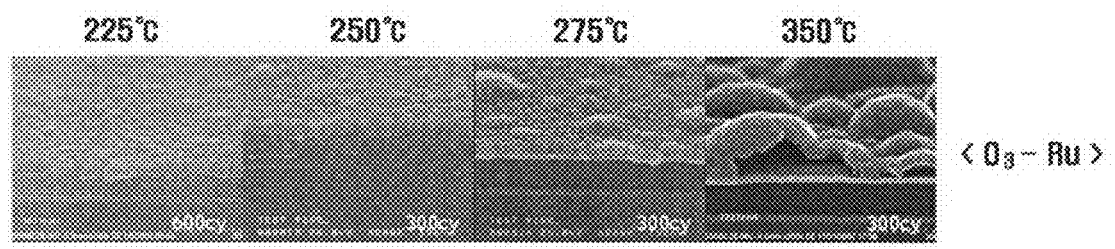
FIGS. 7A and 7B are micrographic views showing various states of deposition of a ruthenium layer when oxygen is used and another ruthenium layer when ozone is used, respectively.
Figure 7B:
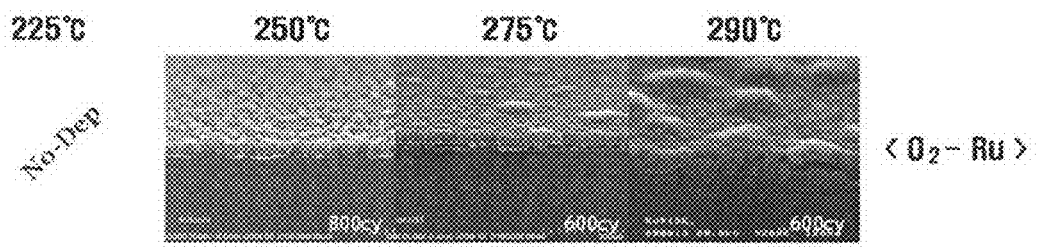

FIGS. 7A and 7B are micrographic views showing various states of deposition of a ruthenium layer when oxygen is used and another ruthenium layer when ozone is used, respectively.

FIG. 7A shows a ruthenium layer formed using ozone ($O_3$—Ru), and FIG. 7B shows the other ruthenium layer formed using oxygen ($O_2$—Ru).

In FIG. 7A, if a ruthenium layer is formed using ozone, it is possible to form the ruthenium layer at a substrate temperature of approximately 225° C. or less. But when oxygen is used, (FIG. 7B) it is difficult to form a ruthenium layer at a substrate temperature of approximately 225° C. or less as represented by reference denotation 'NO-DEP' (no deposition).

Results shown in FIGS. 7A and 7B illustrate that forming a ruthenium layer using ozone having large reactivity as a reaction gas allows deposition to be performed as a low temperature process, the temperature being as low as approximately 225° C.

Furthermore, regarding blisters, blisters are practically not generated in the ruthenium layer formed using ozone at a substrate temperature of approximately 250° C., and yet a very high deposition rate is obtained. But for the ruthenium layer formed using oxygen, it is difficult to form the ruthenium layer at a substrate temperature of approximately 250° C.

As the results shown in FIGS. 6, 7A, and 7B illustrate, it is possible to form the ruthenium layer using ozone without blisters at a low substrate temperature of approximately 225° C. The ruthenium layer's surface roughness is improved when blisters are not formed.

A fourth embodiment includes a method of forming a conformal ruthenium layer by supplying highly concentrated ozone into a chamber to etch unnecessary portions of the ruthenium layer while forming the ruthenium layer using an atomic layer deposition (ALD) method or a chemical vapor deposition (CVD) method. In other words, deposition and etching are repeatedly performed to form the conformal ruthenium layer.

$$\{[\text{ruthenium deposition}] \times m \rightarrow [\text{ruthenium etch}] \times n\} \times N$$

In the above expression, m represents the number of repetition of a deposition cycle to form a ruthenium layer, n represents the number of repetition of an etch process where ozone is used to etch and remove portions of the ruthenium layer, and N represents the total number of repetition of a unit cycle including m deposition cycles and n etch processes to form the entire ruthenium layer of a desired thickness. The ruthenium deposition process includes using an ALD method or a CVD method. For instance, a unit cycle including Ru source/purge/$O_3$/purge in some embodiments is repeated, or a process of supplying a ruthenium source and ozone at substantially the same time in other embodiments is repeated. Also, the ruthenium etch process includes supplying ozone or repeatedly performing a unit cycle which includes $O_3$/purge.

To form a conformal ruthenium layer, the concentration level of ozone in some embodiments is approximately 200 $g/m^3$ or greater because ruthenium tetraoxide ($RuO_4$) is needed in the ruthenium etch process. For instance, the concentration level of ozone is controlled to range from approximately 200 $g/m^3$ to approximately 350 $g/m^3$ during the ruthenium etch process.

When the concentration level of ozone during the ruthenium deposition process using ozone is higher than approximately 100 $g/m^3$, ruthenium is not formed and $RuO_4$ is resulted instead to generate an etch effect. Therefore, the concentration level of ozone is controlled to be approximately 100 g/m$^3$ or less. The concentration level of ozone used during the ruthenium deposition process in some embodiments ranges from approximately 20 g/m$^3$ to approximately 100 g/m$^3$.

When forming a ruthenium layer, a substrate temperature is controlled to be within a range of approximately 150° C. to approximately 400° C. In particular, since the reaction for forming RuO$_4$ is very sensitive to temperature during the ruthenium deposition process using ozone, the substrate temperature is controlled at approximately 300° C. or less. The substrate temperature in some embodiments is controlled to range from approximately 150° C. to approximately 275° C.

One ore more of the following four methods in accordance with some embodiments can be used to perform the ruthenium etch process.

A first method includes increasing the concentration level of ozone used during the ruthenium etch process higher than the concentration level of ozone used during the ruthenium deposition process. The concentration level of ozone used during the ruthenium deposition process in some embodiments ranges from approximately 20 g/m$^3$ to approximately 100 g/m$^3$, and the concentration level of ozone used during the ruthenium etch process in some embodiments is maintained at a highly concentrated level of approximately 200 g/m$^3$ or greater. As described in the first embodiment, when the concentration level of ozone is greater than approximately 100 g/m$^3$, the ruthenium layer may be damaged, and when the concentration level of ozone is greater than approximately 200 g/m$^3$, the etch effect is further increased.

A second method includes supplying ozone at a greater flow rate during the ruthenium etch process than the ruthenium deposition process. Supplying ozone at a greater flow rate etches ruthenium in substantially the same manner as using highly concentrated ozone.

A third method includes maintaining substantially the same level of ozone concentration during the ruthenium deposition process and the ruthenium etch process, but supplying ozone at a greater flow rate during the ruthenium etch process than the ruthenium deposition process.

A fourth method includes increasing the concentration level of ozone used during the ruthenium etch process to be higher than the concentration level of ozone used during the ruthenium deposition process, while at substantially the same time supplying ozone at a greater flow rate during the ruthenium etch process than the ruthenium deposition process.

Figure 8A:
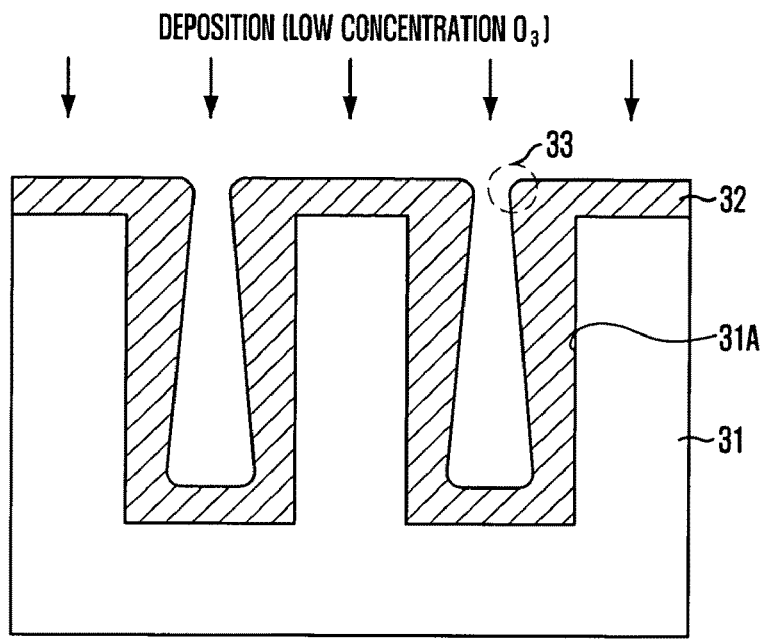
Figure 8B:
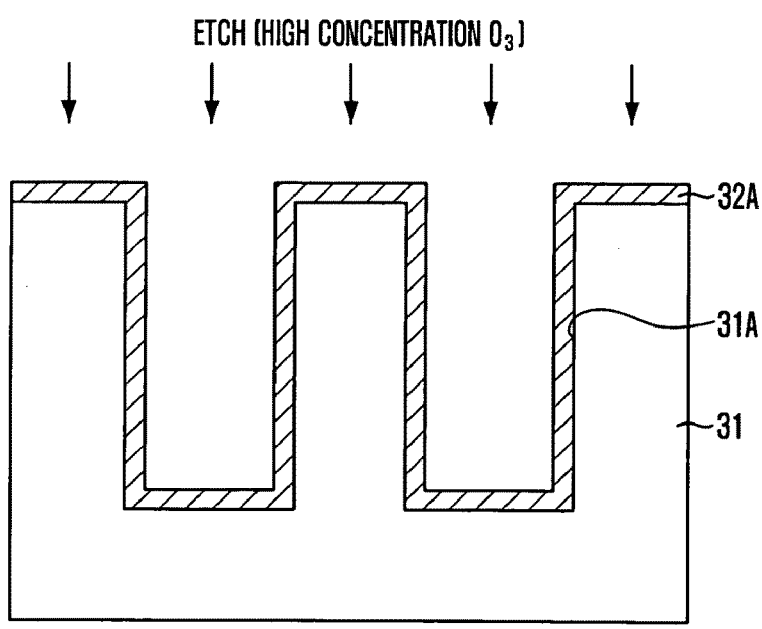

FIGS. 8A to 8C are cross-sectional views disclosing a method of forming a ruthenium (Ru) layer in accordance with the fourth embodiment.

In FIG. 8A, a ruthenium layer 32 is formed over a substrate 31 including a pattern 31A having a high aspect ratio. The ruthenium layer 32 is formed using an atomic layer deposition (ALD) method or a chemical vapor deposition (CVD) method. At this time, the concentration level of ozone (O$_3$) is controlled to be approximately 100 g/m$^3$ or less. For instance, the concentration level of ozone in some embodiments ranges from approximately 20 g/m$^3$ to approximately 100 g/m$^3$. The ruthenium layer 32 is formed to have overhangs 33 due to the shape of the pattern 31A. The overhangs 33 in some embodiments should be removed because the overhangs 33 hinder uniform deposition. The ruthenium layer 32 is formed to have a thickness of approximately 2,000 Å or less.

To remove the overhangs 33, a ruthenium etch process is additionally performed after the ruthenium layer 32 is formed in accordance with the fourth embodiment.

Ozone is supplied to remove the overhangs 33. At this time, the concentration level of ozone is controlled to be higher than the concentration level of ozone used when forming the ruthenium layer 32. For instance, the concentration level of ozone in some embodiments ranges from approximately 200 g/m$^3$ to approximately 350 g/m$^3$ when removing the overhangs 33.

In FIG. 8B, highly concentrated ozone is supplied to etch the ruthenium layer 32 and remove the overhangs 33. Thus, openings in the pattern 31A become wider. Reference denotation 32A refers to a first ruthenium layer 32A after the overhangs 33 have been removed.

The principle of ruthenium etch is expressed as follows:

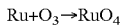

$$Ru + O_3 \rightarrow RuO_4$$

RuO$_4$ is an oxidation by-product of ruthenium and has a volatile property. Thus, RuO$_4$ is removed when purging is performed after etching using ozone.

By repeatedly performing the ruthenium deposition shown in FIG. 8A and the etching using ozone shown in FIG. 8B, a very conformal ruthenium layer is formed over a pattern, such as a deep trench.

In FIG. 8C, another ruthenium layer is formed over the first ruthenium layer 32A and etching is performed again to remove any overhangs 33 that may have occurred during the formation of the another ruthenium layer. Thus, a second ruthenium layer 32B is formed over the first ruthenium layer 32A, forming a conformal ruthenium layer 34.

By repeatedly performing ruthenium deposition and etching, a ruthenium layer having a uniform thickness is formed even over a pattern having a high aspect ratio, such as a deep trench. The pattern in some embodiments includes a region where a concave-type bottom electrode or a cylinder-type bottom electrode is to be formed.

In the methods disclosed in accordance with the first to fourth embodiments, the concentration level of ozone in some embodiments is diluted by using oxygen to control the ozone concentration level. Also, the thickness of a ruthenium layer in some embodiments is controlled to range from approximately 50 Å to approximately 1,000 Å. The substrate temperature for forming a ruthenium layer in some embodiments is controlled to range from approximately 150° C. to approximately 275° C.

Furthermore, the ruthenium layer formed in the first to fourth embodiments in some embodiments is used as one or more of bottom electrode of a capacitor, upper electrode of a capacitor, gate electrode, bit line, metal line, and copper plating seed layer.

The concentration level of ozone during deposition in the first to fourth embodiments is kept at a low level ranging from approximately 20 g/m$^3$ to approximately 100 g/m$^3$ so that the substrate temperature is lowered to range from approximately 150° C. to approximately 275° C. However, other arrangements are not excluded. For example, a ruthenium layer is formed in further embodiments using an inverse proportional relationship between the ozone concentration level and substrate temperature.

In other words, a ruthenium layer in further embodiments is formed using the inverse proportional relationship in which the substrate temperature increases when the ozone concentration level decreases and, conversely, the substrate temperature decreases when the ozone concentration level increases.

For instance, a ruthenium layer is formed using ozone as a reaction gas having a concentration level ranging from approximately 50 g/m$^3$ to approximately 300 g/m$^3$ at a substrate temperature ranging from approximately 150° C. to approximately 275° C. In other words, even if the ozone concentration level increases to approximately 300 g/m³, a ruthenium layer having a sufficient level of surface roughness is formable in some embodiments by keeping a low substrate temperature, e.g., as low as approximately 150° C. Also, even if the substrate temperature increases to approximately 275° C., a ruthenium layer having a sufficient level of surface roughness is formable in some embodiments by decreasing the ozone concentration level to a low level, e.g., as low as approximately 50 g/m³.

Therefore, a thin ruthenium layer having a sufficient level of adhesive strength and high deposition rate in some embodiments is obtainable at a low temperature without blisters using the inverse proportion characteristic of the ozone concentration level and substrate temperature.

Figure 9:
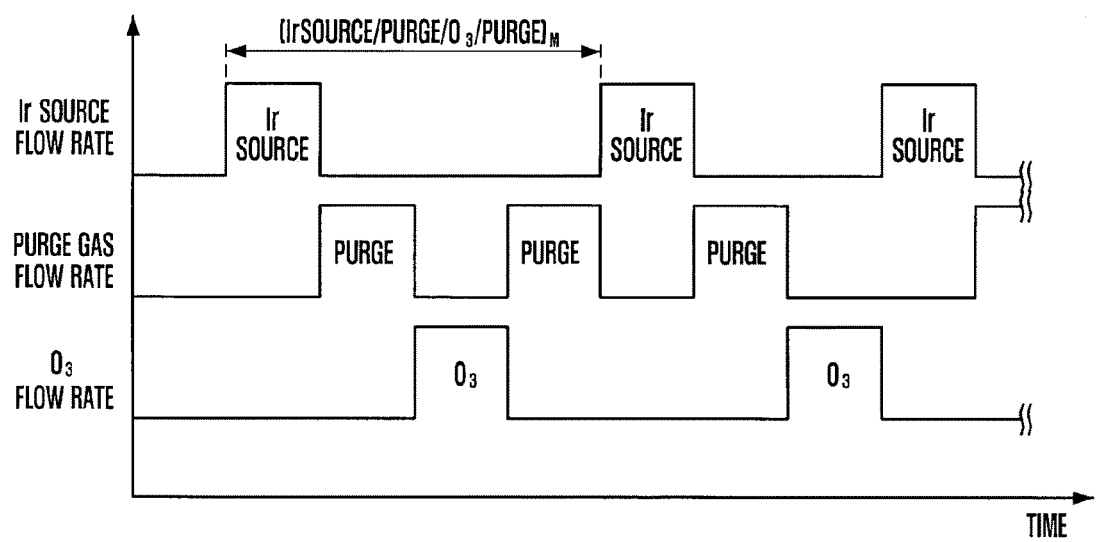
FIG. 9 is a timing diagram showing an ALD method of forming an iridium layer in accordance with a fifth embodiment.

FIG. 9 is a timing diagram showing an atomic layer deposition (ALD) method of forming an iridium (Ir) layer in accordance with a fifth embodiment.

In FIG. 9, atomic layer deposition of an iridium layer includes repeatedly performing a process of Ir source/purge/reaction gas/purge for M times. The process of Ir source/purge/reaction gas/purge refers to a process that includes supplying an iridium source, purging, supplying a reaction gas, and another purging. The process of Ir source/purge/reaction gas/purge is a unit cycle for atomic layer deposition of the iridium layer. According to the fifth embodiment, the reaction gas includes ozone ($O_3$).

Supplying the iridium source includes supplying the iridium source into a chamber including a substrate whereon an iridium layer is to be formed. The iridium source is then adsorbed on the surface of the substrate by supplying the iridium source. The iridium source in some embodiments includes at least one selected from the group consisting of Ir($\eta$3-$C_3H_5$)$_3$, Ir$_9$(Cp)($C_2H_4$)$_2$, Ir(COD)(Cp), Ir(Cp)(MeCp), Ir(EtCp)(COD), Ir(EtCp)(CHD), and Ir(EtCp)($C_2H_4$)$_2$. The iridium sources include solid or liquid organic metal compounds and in some embodiments are supplied into the chamber in a gaseous state after being vaporized through a separate vaporizer. Also, the above described iridium sources are referred to as iridium precursors comprising iridium.

Ligand adhering to iridium metal atoms in the above described sources reacts with the reaction gas to form an iridium layer. The substrate on which the iridium layer is to be formed in some embodiments includes a silicon (Si) layer, a silicon oxide ($SiO_2$) layer, a metal layer including a titanium (Ti) layer, a metal nitride layer including a titanium nitride (TiN) layer, and a dielectric layer including a zirconium dioxide ($ZrO_2$) layer. When performing an atomic layer deposition process, a deposition temperature ranging from approximately 150° C. to approximately 400° C. is maintained. If the deposition temperature is lower than approximately 150° C., the iridium source may not be adsorbed on the surface of the substrate. If the deposition temperature is higher than approximately 400° C., the substrate may be damaged by the high temperature. For instance, the deposition temperature ranges from approximately 150° C. to approximately 275° C. As will be described later on, the deposition temperature is variable depending on the concentration level of ozone. The deposition temperature is often referred to as a substrate temperature.

Purging includes removing the residual iridium source after the adsorption reaction. A purge gas in some embodiments includes an inert gas which does not react with the iridium source such as argon (Ar) and/or nitrogen ($N_2$). Also, the residual iridium source in some embodiments is removed by pumping.

Supplying a reaction gas includes supplying a reaction gas into the chamber to remove ligand from the adsorbed iridium source. The reaction gas includes ozone. Ozone in some embodiments includes ozone generated by an ozonizer. Ozone is supplied for a time period of approximately 5 seconds or less, flowing at approximately 100 sccm to approximately 2,000 sccm.

The other purging includes purging reaction by-products generated by the ozone-ligand reaction as well as residual ozone from the chamber. An inert gas, including argon and/or nitrogen, is used during the other purging. Also, the other purging in some embodiments includes removing the residual iridium source by pumping.

An iridium layer in atomic layer unit having a sufficient level of step coverage is formed in some embodiments by repeating the unit cycle of Ir source/purge/$O_3$/purge M times.

According to the fifth embodiment, the reaction gas for decomposing the iridium source includes ozone. Ozone allows forming a pure iridium layer which does not contain oxygen by removing ligand including carbon (C), hydrogen (H), and oxygen (O) adhering to the iridium source.

The concentration level of ozone should be controlled because if the ozone concentration or flow is excessive, the adsorbed iridium source may be separated or etched, for instance, when the concentration level of ozone ranges from approximately 200 g/m³ to approximately 350 g/m³. The concentration level of ozone in some embodiments is controlled to range from approximately 20 g/m³ to approximately 100 g/m³. Controlling the concentration level of ozone further accelerates the reaction with the iridium source at the surface of the substrate. Consequently, a uniform and continuous iridium layer is formed to a small thickness while minimizing the incubation time.

If the concentration level of ozone is less than approximately 20 g/m³, the reaction with the iridium source may not be sufficient and thus may cause a large amount of impurities to form within the iridium layer. If the concentration level of ozone is higher than approximately 100 g/m³, the adsorbed iridium source may be separated or etched, causing damage to the resulting iridium layer. Therefore, the concentration level of ozone in some embodiments ranges from approximately 20 g/m³ to approximately 100 g/m³.

Furthermore, ozone generally has higher reactivity than oxygen. Thus, the impurity concentration within the iridium layer is minimizable, and the iridium layer is formable at a low temperature. The high reactivity allows lowering of a deposition temperature during the formation of the iridium layer, and thus the iridium layer is formable at a low temperature.

Figure 10:
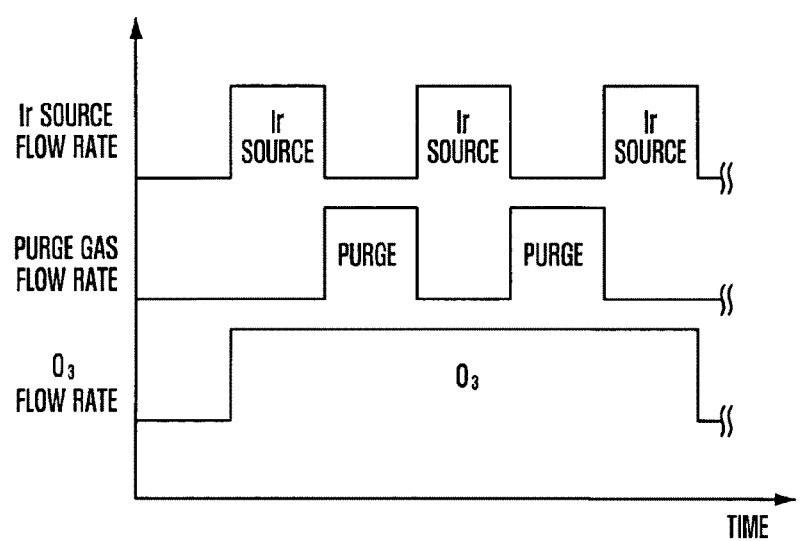
FIG. 10 is a timing diagram showing an ALD method of forming an iridium layer in accordance with a sixth embodiment.

FIG. 10 is a timing diagram showing an atomic layer deposition (ALD) method of forming an iridium layer in accordance with a sixth embodiment.

In FIG. 10, atomic layer deposition of an iridium layer includes repeatedly performing a process of supplying an iridium source and purging while continuously supplying ozone ($O_3$).

Supplying the iridium source includes supplying the iridium source into a chamber including a substrate whereon an iridium layer is to be formed. The iridium source is then adsorbed on the surface of the substrate by supplying the iridium source. The iridium source in some embodiments includes at least one selected from the group consisting of Ir($\eta$3-$C_3H_5$)$_3$, Ir$_9$(Cp)($C_2H_4$)$_2$, Ir(COD)(Cp), Ir(Cp)(MeCp), Ir(EtCp)(COD), Ir(EtCp)(CHD), and Ir(EtCp)($C_2H_4$)$_2$. The iridium sources include solid or liquid organic metal compounds and in some embodiments are supplied into the chamber in a gaseous state after being vaporized through a separate vaporizer.

Ligand adhering to iridium metal atoms in the above described sources reacts with the reaction gas to form an iridium layer. The substrate on which the iridium layer is to be formed in some embodiments includes a silicon (Si) layer, a silicon oxide ($SiO_2$) layer, a metal layer including a titanium (Ti) layer, a metal nitride layer including a titanium nitride (TiN) layer, and a dielectric layer including a zirconium dioxide ($ZrO_2$) layer. When performing an atomic layer deposition process, a deposition temperature ranging from approximately 150° C. to approximately 400° C. is maintained. If the deposition temperature is lower than approximately 150° C., the iridium source may not be adsorbed on the surface of the substrate. If the deposition temperature is higher than approximately 400° C., the substrate may be damaged by the high temperature. For instance, the deposition temperature ranges from approximately 150° C. to approximately 275° C. As will be described later on, the deposition temperature is variable depending on the concentration level of ozone.

Purging includes removing the residual iridium source after the adsorption reaction. A purge gas in some embodiments includes an inert gas which does not react with the iridium source such as argon (Ar) and/or nitrogen ($N_2$). Also, the residual iridium source in some embodiments is removed by pumping.

Supplying ozone includes supplying ozone to remove ligand from the adsorbed iridium source. Ozone in some embodiments includes ozone generated by an ozonizer.

In accordance with the sixth embodiment, an iridium layer is formed by repeatedly performing a process of supplying the iridium source and purging while continuously supplying ozone as a reaction gas for decomposing the iridium source.

Ozone allows forming a pure iridium layer which does not contain oxygen by removing ligand including carbon (C), hydrogen (H), and oxygen (O) adhering to the iridium source.

The concentration level of ozone should be controlled because if the ozone concentration or flow is excessive, the adsorbed iridium source may be separated or etched. For instance, the concentration level of ozone ranges from approximately 20 $g/m^3$ to approximately 100 $g/m^3$. Controlling the concentration level of ozone further accelerates the reaction with the iridium source at the surface of the substrate. Consequently, a uniform and continuous iridium layer is formed to a small thickness while minimizing the incubation time.

If the concentration level of ozone is less than approximately 20 $g/m^3$, the reaction with the iridium source may not be sufficient and thus may cause a large amount of impurities to form within the iridium layer. If the concentration level of ozone is higher than approximately 100 $g/m^3$, the adsorbed iridium source may be separated or etched, causing damage to the resulting iridium layer. Therefore, the concentration level of ozone in some embodiments ranges from approximately 20 $g/m^3$ to approximately 100 $g/m^3$.

Furthermore, ozone generally has higher reactivity than oxygen. Thus, the impurity concentration within the iridium layer is minimizable, and the iridium layer is formable at a low temperature. The high reactivity allows lowering of a deposition temperature during the formation of the iridium layer, and thus the iridium layer is formable at a low temperature.

Unlike the ALD method, a chemical vapor deposition (CVD) method includes supplying reaction sources at substantially the same time to form a thin layer. For instance, when A gas and B gas are used, A gas and B gas are supplied at substantially the same time to form a thin layer on a substrate.

In the following section, a CVD method of forming a noble metal layer, i.e., an iridium layer, in accordance with a seventh embodiment is described. Thus, A gas represents an iridium source and B gas represents a reaction gas for decomposing the iridium source. When a CVD method uses an iridium source including an organic metal compound, the CVD method is referred to as a metal organic chemical vapor deposition method.

Figure 11:
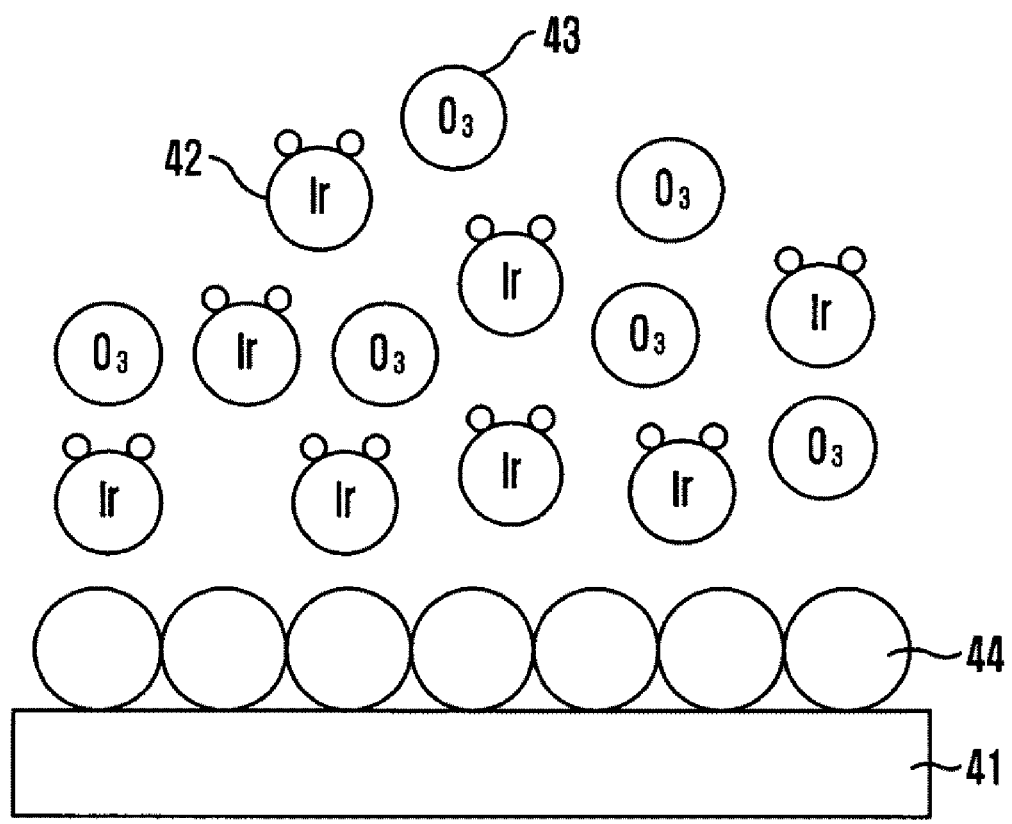
FIG. 11 is a diagram showing a CVD method of forming an iridium layer in accordance with a seventh embodiment.

FIG. 11 is a diagram showing a chemical vapor deposition (CVD) method of forming an iridium (Ir) layer in accordance with the seventh embodiment.

In FIG. 11, chemical vapor deposition of an iridium layer includes supplying an iridium source 42 and a reaction gas 43 at substantially the same time to form an iridium layer 44 over a substrate 41. Reaction by-products are removed by purging. Purging in some embodiments includes blowing inert gas such as argon (Ar) and/or nitrogen ($N_2$) or pumping.

The reaction gas 43 includes ozone ($O_3$). Ozone in some embodiments includes ozone generated by an ozonizer or other methods. The other methods include a method of generating ozone by reacting oxygen gas and nitrogen gas. There are many other methods to generate ozone.

The iridium source 42 in some embodiments includes at least one selected from the group consisting of $Ir(\eta3-C_3H_5)_3$, $Ir_9(Cp)(C_2H_4)_2$, $Ir(COD)(Cp)$, $Ir(Cp)(MeCp)$, $Ir(EtCp)(COD)$, $Ir(EtCp)(CHD)$, and $Ir(EtCp)(C_2H_4)_2$. The iridium source 42 includes a solid or liquid organic metal compound and in some embodiments is supplied into the chamber in a gaseous state after being vaporized through a separate vaporizer.

Ligand adhering to iridium metal atoms in the iridium source 42 reacts with the reaction gas 43 to form the iridium layer 44. The substrate 41 on which the iridium layer 44 is to be formed in some embodiments includes a silicon (Si) layer, a silicon oxide ($SiO_2$) layer, a metal layer including a titanium (Ti) layer, a metal nitride layer including a titanium nitride (TiN) layer, and a dielectric layer including a zirconium dioxide ($ZrO_2$) layer. When performing a chemical vapor deposition process, a temperature ranging from approximately 150° C. to approximately 400° C. is maintained. If the deposition temperature is lower than approximately 150° C., the iridium source 42 may not be adsorbed on the surface of the substrate 41. If the deposition temperature is higher than approximately 400° C., the substrate 41 may be damaged by the high temperature. For instance, the deposition temperature in some embodiments ranges from approximately 150° C. to approximately 275° C. As will be described later on, the deposition temperature is variable depending on the concentration level of ozone.

According to the seventh embodiment, the reaction gas 43 includes ozone for decomposing the iridium source 42. The concentration level of ozone should be controlled because if the ozone concentration or flow is excessive, the adsorbed iridium source 42 in some embodiments is separated or etched. For instance, the concentration level of ozone ranges from approximately 20 $g/m^3$ to approximately 100 $g/m^3$. Controlling the concentration level of ozone further accelerates the reaction with the iridium source 42 at the surface of the substrate 41. Consequently, the iridium layer 44 that is uniform and continuous is formed to a small thickness while minimizing the incubation time. Furthermore, ozone generally has higher reactivity than oxygen. Thus, the impurity concentration within the iridium layer 44 is minimizable, and the iridium layer 44 is formable at a low temperature.

If the concentration level of ozone is less than approximately 20 $g/m^3$, the reaction with the iridium source 42 may not be sufficient and thus may cause a large amount of impurities to form within the iridium layer 44. If the concentration level of ozone is higher than approximately 100 $g/m^3$, the adsorbed iridium source 42 may be separated or etched, causing damage to the resulting iridium layer 44. Therefore, the concentration level of ozone in some embodiments ranges from approximately 20 $g/m^3$ to approximately 100 $g/m^3$.

Arrhenius plots displaying the effect of the deposition temperature on the deposition rate of an iridium layer formed over a substrate show substantially the same characteristics as those of a ruthenium layer shown in FIG. 5.

In other words, oxygen has larger activation energy (Ea) than ozone. The larger activation energy of oxygen than ozone means that oxygen has lower reactivity than ozone.

When using ozone as a reaction gas, a temperature range of the surface reaction limited section may be decreased to a lower temperature range than when oxygen having low reactivity is used. In other words, an iridium layer may be formed using ozone at a lower temperature than when using oxygen.

Furthermore, assuming the deposition temperature to be substantially the same, using ozone results in a higher deposition rate than when using oxygen. Assuming that the deposition rate is substantially the same, a deposition process may be performed at a lower temperature when using ozone compared to using oxygen.

By adequately controlling the concentration level of ozone, substrate-dependency of an iridium source is minimizable and the deposition rate is maximizable compared to using oxygen. Also, the high reactivity of ozone allows the deposition temperature to be very low, and so an iridium layer is formable at a low temperature. An iridium layer in some embodiments is formed using a CVD method at a low temperature in the surface reaction limited section, thus forming a thin layer having a highly sufficient level of step coverage. For instance, the concentration level of ozone is adequately controlled in some embodiments within a range of approximately 20 g/m$^3$ to approximately 100 g/m$^3$ to control reactivity of ozone.

An eighth embodiment includes a method of forming a conformal iridium layer by supplying highly concentrated ozone into a chamber to etch unnecessary portions of the iridium layer while forming the iridium layer using an atomic layer deposition (ALD) method or a chemical vapor deposition (CVD) method. In other words, deposition and etching are repeatedly performed to form the conformal iridium layer.

$$\{[\text{iridium deposition}] \times m \rightarrow [\text{iridium etch}] \times n\} \times N$$

In the above expression, m represents the number of repetition of a deposition cycle to form an iridium layer, n represents the number of repetition of an etch process where ozone is used to etch and remove portions of the iridium layer, and N represents the total number of repetition of a unit cycle including m deposition cycles and n etch processes to form the entire iridium layer of a desired thickness. The iridium deposition process includes using an ALD method or a CVD method. For instance, a unit cycle including Ir source/purge/O$_3$/purge is repeated in some embodiments, or a process of supplying an iridium source and ozone at substantially the same time in further embodiments is repeated. Also, the iridium etch process includes supplying ozone or repeatedly performing a unit cycle which includes O$_3$/purge.

To form a conformal iridium layer, the concentration level of ozone in some embodiments is approximately 200 g/m$^3$ or greater because IrO$_4$ is needed in the iridium etch process. For instance, the concentration level of ozone is controlled to range from approximately 200 g/m$^3$ to approximately 350 g/m$^3$ during the iridium etch process.

When the concentration level of ozone during the iridium deposition process using ozone is higher than approximately 100 g/m$^3$, iridium is not formed and IrO$_4$ is resulted instead to generate an etch effect. Therefore, the concentration level of ozone is controlled to be approximately 100 g/m$^3$ or less. For instance, the concentration level of ozone used during the iridium deposition process in some embodiments ranges from approximately 20 g/m$^3$ to approximately 100 g/m$^3$.

When forming an iridium layer, a substrate temperature is controlled to be within a range of approximately 150° C. to approximately 400° C. In particular, since the reaction for forming IrO$_4$ is very sensitive to temperature during the iridium deposition process using ozone, the substrate temperature is controlled at approximately 300° C. or less. The substrate temperature in some embodiments is controlled to range from approximately 150° C. to approximately 275° C.

One ore more of the following four methods in accordance with some embodiments can be used to perform the iridium etch process.

A first method includes increasing the concentration level of ozone used during the iridium etch process higher than the concentration level of ozone used during the iridium deposition process. The concentration level of ozone used during the iridium deposition process in some embodiments ranges from approximately 20 g/m$^3$ to approximately 100 g/m$^3$, and the concentration level of ozone used during the iridium etch process in some embodiments is maintained at a highly concentrated level of approximately 200 g/m$^3$ or greater. As it was described in the fifth embodiment, when the concentration level of ozone is greater than approximately 100 g/m$^3$, the iridium layer in some embodiments is damaged, and when the concentration level of ozone is greater than approximately 200 g/m$^3$, the etch effect is further increased.

A second method includes supplying ozone at a greater flow rate during the iridium etch process than the iridium deposition process. Supplying ozone at a greater flow rate etches iridium in substantially the same manner as using highly concentrated ozone.

A third method includes maintaining substantially the same level of ozone concentration during the iridium deposition process and the iridium etch process, but supplying ozone at a greater flow rate during the iridium etch process than the iridium deposition process.

A fourth method includes increasing the concentration level of ozone used during the iridium etch process to be higher than the concentration level of ozone used during the iridium deposition process, while at substantially the same time supplying ozone at a greater flow rate during the iridium etch process than the iridium deposition process.

Figure 12A:
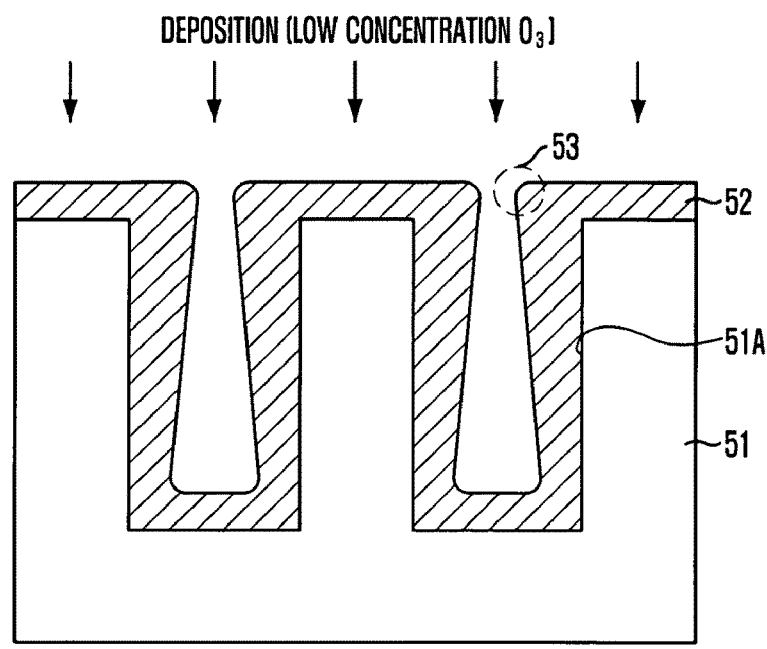
FIGS. 12A to 12C are cross-sectional views showing a method of forming an iridium layer in accordance with an eighth embodiment.
Figure 12B:
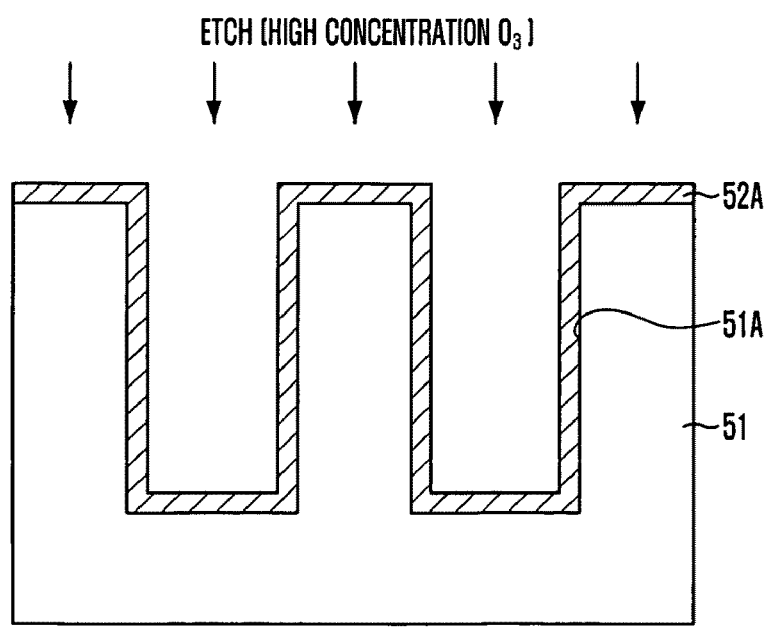
Figure 12C:
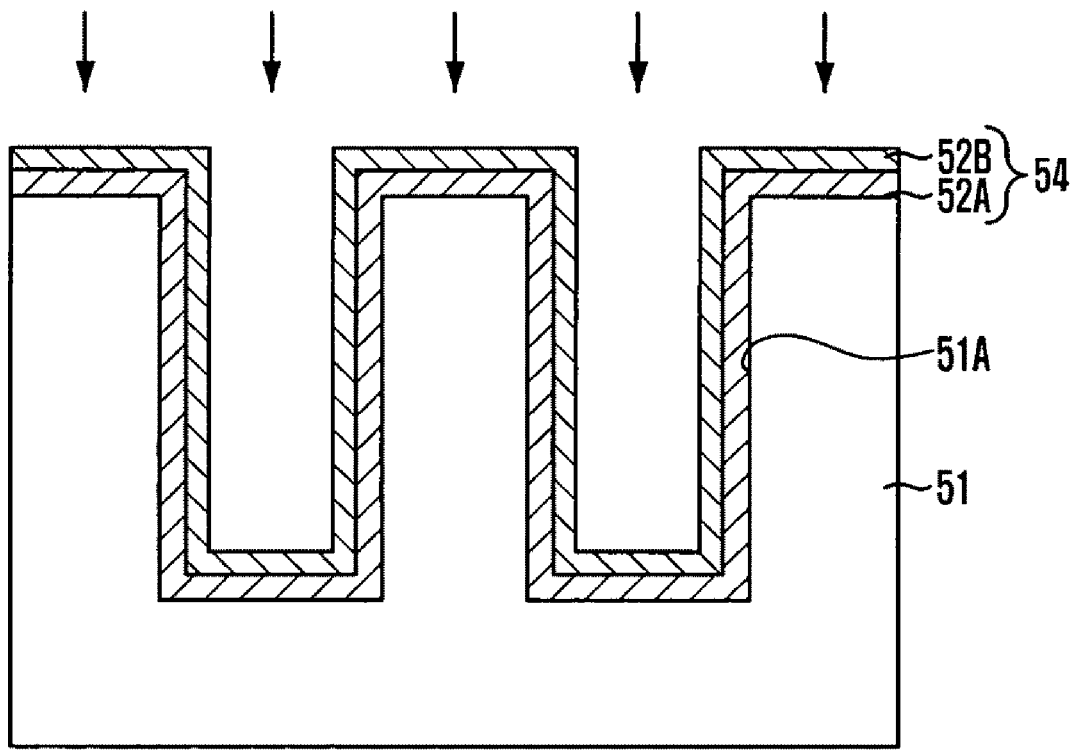

FIGS. 12A to 12C are cross-sectional views disclosing a method of forming an iridium layer in accordance with the eighth embodiment.

In FIG. 12A, an iridium layer 52 is formed over a substrate 51 including a pattern 51A having a high aspect ratio. The iridium layer 52 is formed using an atomic layer deposition (ALD) method or a chemical vapor deposition (CVD) method. At this time, the concentration level of ozone (O$_3$) is controlled to be approximately 100 g/m$^3$ or less. For instance, the concentration level of ozone in some embodiments ranges from approximately 20 g/m$^3$ to approximately 100 g/m$^3$. The iridium layer 52 is formed to have overhangs 53 due to the shape of the pattern 51A. The overhangs 53 in some embodiments should be removed because the overhangs 53 hinder uniform deposition. The iridium layer 52 is formed to have a thickness of approximately 2,000 Å or less.

Thus, an iridium etch process is additionally performed to remove the overhangs 53 after the iridium layer 52 is formed in accordance with the eighth embodiment.

Ozone is supplied to remove the overhangs 53. At this time, the concentration level of ozone is controlled to be higher than the concentration level of ozone used when forming the iridium layer 52. For instance, the concentration level of ozone in some embodiments ranges from approximately 200 g/m³ to approximately 350 g/m³ when removing the overhangs 53.

In FIG. 12B, highly concentrated ozone is supplied to etch the iridium layer 52 and remove the overhangs 53. Thus, openings in the pattern 51A become wider. Reference denotation 52A refers to a first iridium layer 52A after the overhangs 53 have been removed.

The principle of iridium etch is expressed as follows:

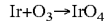

$IrO_4$ is an oxidation by-product of iridium and has a volatile property. Thus, $IrO_4$ is removed when purging is performed after etching using ozone.

By repeatedly performing the iridium deposition shown in FIG. 12A and the etching using ozone shown in FIG. 12B, a very conformal iridium layer is formed over a pattern, such as a deep trench.

In FIG. 12C, another iridium layer is formed and etched over the first iridium layer 52A and etching is performed again to remove any overhangs 53 that may have occurred during the formation of the another iridium layer. Thus, a second iridium layer 52B is formed over the first iridium layer 52A, forming a conformal iridium layer 54.

By repeatedly performing iridium deposition and etching, an iridium layer having a uniform thickness is formed even over a pattern that has a high aspect ratio, such as a deep trench. The pattern in some embodiments includes a region where a concave-type bottom electrode or a cylinder-type bottom electrode is to be formed.

In the methods disclosed in accordance with the fifth to eighth embodiments, the fixed concentration level of ozone in some embodiments is diluted by using oxygen ($O_2$) or hydrogen ($H_2$) to control the ozone concentration level. Also, the thickness of an iridium layer in some embodiments is controlled to range from approximately 50 Å to approximately 1,000 Å. The substrate temperature for forming an iridium layer in some embodiments is controlled to range from approximately 150° C. to approximately 275° C.

Furthermore, the iridium layer formed in the fifth to eighth embodiments in some embodiments is used as one or more of bottom electrode of a capacitor, upper electrode of a capacitor, gate electrode, bit line, metal line, and copper plating seed layer.

The concentration level of ozone during deposition in the fifth to eighth embodiments is kept at a low level ranging from approximately 20 g/m³ to approximately 100 g/m³ so that the substrate temperature is lowered to range from approximately 150° C. to approximately 275° C. However, other arrangements are not excluded. For example, an iridium layer is formed in further embodiments using an inverse proportional relationship between the ozone concentration level and substrate temperature.

In other words, an iridium layer in further embodiments is formed using the inverse proportional relationship in which the substrate temperature increases when the ozone concentration level decreases and conversely the substrate temperature decreases when the ozone concentration level increases.

For instance, an iridium layer is formed using ozone as a reaction gas having a concentration level ranging from approximately 50 g/m³ to approximately 300 g/m³ at a substrate temperature ranging from approximately 150° C. to approximately 275° C. In other words, even if the ozone concentration level increases to approximately 300 g/m³, an iridium layer having a sufficient level of surface roughness is formable in some embodiments by keeping a low substrate temperature, e.g., as low as approximately 150° C. Also, even if the substrate temperature increases to approximately 275° C., an iridium layer having a sufficient level of surface roughness in some embodiments is formable by decreasing the ozone concentration level to a low level, e.g., as low as approximately 50 g/m³.

Therefore, a thin iridium layer having a sufficient level of adhesive strength and high deposition rate in some embodiments is obtainable at a low temperature without blisters using the inverse proportion characteristic of the ozone concentration level and substrate temperature.

While exemplary embodiments have been described, it will be apparent to those skilled in the art that various changes and modifications may be made without departing from the spirit and scope of the disclosure.

What is claimed is:

1. A method of forming a noble metal layer, comprising:
    performing a deposition process by using a noble metal source and a reaction gas, the reaction gas consisting essentially of ozone ($O_3$), wherein the ozone has a first concentration level ranging from approximately 20 g/m³ to approximately 100 g/m³, and wherein the noble metal layer is formed over a substrate at a substrate temperature ranging from approximately 150° C. to approximately 275° C.; and
    performing an etch process using ozone having a concentration level of ranges from approximately 200 g/m³ to approximately 350 g/m³.

2. The method of claim 1, wherein the performing of the deposition process comprises using an atomic layer deposition (ALD) method, the ALD method comprising repeatedly performing supplying the noble metal source, purging, supplying the ozone as the reaction gas, and purging as one cycle.

3. The method of claim 1, wherein the performing of the deposition process comprises using an atomic layer deposition (ALD) method, the ALD method comprising repeatedly performing supplying the noble metal source and purging while continuously supplying the ozone as one cycle.

4. The method of claim 1, wherein the performing of the deposition process comprises using a chemical vapor deposition (CVD) method, the CVD method including supplying the noble metal source and the ozone at substantially the same time.

5. The method of claim 1, wherein the noble metal layer comprises one of a ruthenium (Ru) layer and iridium (Ir) layer.

6. The method of claim 1, wherein the noble metal source comprises at least one selected from the group consisting of $Ru(Cp)_2$, $Ru(MeCp)_2$, $Ru(EtCp)_2$, $Ru(tmhd)_3$, $Ru(mhd)_3$, $Ru(od)_3$, $Ir(\eta3-C_3H_5)_3$, $Ir_9(Cp)(C_2H_4)_2$, $Ir(COD)(Cp)$, $Ir(Cp)(MeCp)$, $Ir(EtCp)(COD)$, $Ir(EtCp)(CHD)$, and $Ir(EtCp)(C_2H_4)_2$.

7. A method of forming a noble metal layer, comprising:
    performing a deposition process by using a noble metal source and a reaction gas, the reaction gas consisting essentially of ozone ($O_3$), wherein the ozone has a first concentration level ranging from approximately 20 g/m³ to approximately 100 g/m³; and
    performing an etch process using ozone having a second concentration level, wherein the second concentration level ranges from approximately 200 g/m³ to approximately 350 g/m³.

* * * * *